United States Patent [19]

Howlett et al.

[11] 3,919,657

[45] Nov. 11, 1975

[54] WIDE DYNAMIC RANGE AMPLIFIER SYSTEM WITH SLEW RATE CONTROL

[75] Inventors: Donald L. Howlett; Ernest E. Godsey; Carl R. Martin, all of Houston, Tex.

[73] Assignee: Texaco Inc., New York, N.Y.

[22] Filed: Nov. 12, 1973

[21] Appl. No.: 415,022

[52] U.S. Cl. .......................... 330/51; 340/347 AD

[51] Int. Cl.[2] .................... H03F 1/14; H03K 13/02

[58] Field of Search ............... 330/16, 29, 30 R, 51; 307/235; 340/347 AD

[56] References Cited

UNITED STATES PATENTS

| | | | |
|---|---|---|---|
| 3,525,948 | 8/1970 | Sherer et al. | 330/110 |
| 3,562,504 | 2/1971 | Harris | 340/347 DD X |
| 3,562,744 | 2/1971 | Howlett | 330/1 |
| 3,603,972 | 9/1971 | Vanderford | 340/347 AD |
| 3,636,463 | 1/1972 | Ongkiehong | 330/29 |
| 3,742,489 | 6/1973 | Lefevre et al. | 330/1 X |
| 3,813,609 | 5/1974 | Wilkes et al. | 330/51 |

*Primary Examiner*—Thomas J. Sloyan
*Attorney, Agent, or Firm*—T. H. Whaley; C. G. Ries; Ronald G. Gillespie

[57] ABSTRACT

A wide dynamic range automatic high speed digital gain ranging amplifier system and a plurality of amplifier stages coupled in cascade circuit relationship. The respective outputs of the amplifier stages are coupled through a common output circuit to a comparator circuit for comparison with a predetermined reference signal. Sequence means in cooperation with a slew rate control circuit are provided for momentarily closing switch means for time sequentially coupling respective output of successive amplifier stages in comparator circuit during successive relatively brief sampling time intervals. Means is provided for selectively maintaining one of the switches in its closed position the holding time interval of longer duration than the sampling time intervals or an output signal coupled through the switch means to the common output circuit during one of the sampling intervals being a predetermined relationship to the reference signal in a preferred embodiment of the slew rate control circuit prevents the selection of the switch means so that the change in the common output signal does not exceed either a predetermined slew rate or signal change or a predetermined full scale value.

4 Claims, 2 Drawing Figures

WIDE DYNAMIC RANGE AMPLIFIER SYSTEM WITH SLEW RATE CONTROL

BACKGROUND OF THE INVENTION

1. Field of the Invention

The present invention relates generally to wide dynamic range amplifier systems and more particularly to automatic high speed gain range amplifier systems capable of handling wide dynamic range signals, such as those encountered in seismic data processing and therefore is particularly suitable for use in a digital seismic recording system.

2. Description of the Prior Art

Heretofore, a wide dynamic range amplifier system such as that described in U.S. Pat. No. 3,603,972 assigned to Texaco Inc., assignee of the present invention, provided a multiplexed common output as a function of a required gain. In operation, at the first of each channel period, the gain is set to a minimum value. Following at specific time intervals, the gain increases in discrete steps until the output signal exceeds full scale or until the maximum gain is reached so as to provide the largest possible signal for recording.

When seismic signals from the seismic apparatus have a high amplitude and a high frequency, very large slew rates occur as each seismic signal passes through zero. Since the instantaneous value of the signal is small, the cascaded amplifier system will try to gain range all the way to full gain. While this amplifies the signal level it also amplifies the slew rate. This results in the cascaded amplifier system output having a slew rate too fast for the A to D converter to sample. The system of the present invention includes circuitry for sensing the slew rate of the output signal. When the slew rate exceeds a predetermined rate, the gain is decreased although this may result in an output signal below full scale level the result of the A to D conversion is more reliable.

Further, the slew rate circuitry also prevents the possibility of the output signal from exceeding full scale due to the signal continuing to change between the time that the gain selection is made and the time the analog to digital conversion is made. The level sensing comparators will select the gain such that the output is slightly less than full scale (nominally 80%–90% of full scale). By choosing a proper combination of maximum allowable slew rate and maximum instantaneous level, the common output signal cannot exceed full scale within the time period of one channel.

SUMMARY OF THE INVENTION

A wide dynamic range automatic high speed gain ranging amplifier system includes a plurality of cascaded amplifier stages. Each amplifier stage provides an output signal to a switching network. The switching network during respective sampling time intervals passes the amplifiers output signals to a comparator. Each output signal from the amplifier stages is compared with a reference signal. A circuit is responsive to the comparator for selecting and holding a signal passed by the switching network from an amplifier stage so as to provide the selected signal as a common output signal. A circuit receiving the common output signal determines the slew rate of the common output signal resulting from different amplifier stages outputs signals being used as the common output signal and provides a corresponding signal. The selecting and holding circuit is responsive to a comparator receiving the slew rate signal and a reference signal corresponding to a maximum slew rate so that the selecting and holding circuit provides only those amplifier stage output signals as the common output signal which will not cause the common output signal to have an excessive slew rate.

The objects and advantages of the invention will appear more fully hereinafter from a consideration of the detailed description which follows taken together with the accompanying drawings wherein one embodiment of the invention is illustrated by way of example. It is to be expressly understood, however, that the drawings are for illustration purposes only and are not to be construed as defining the limits of the invention.

DESCRIPTION OF THE INVENTION

Figure 1:
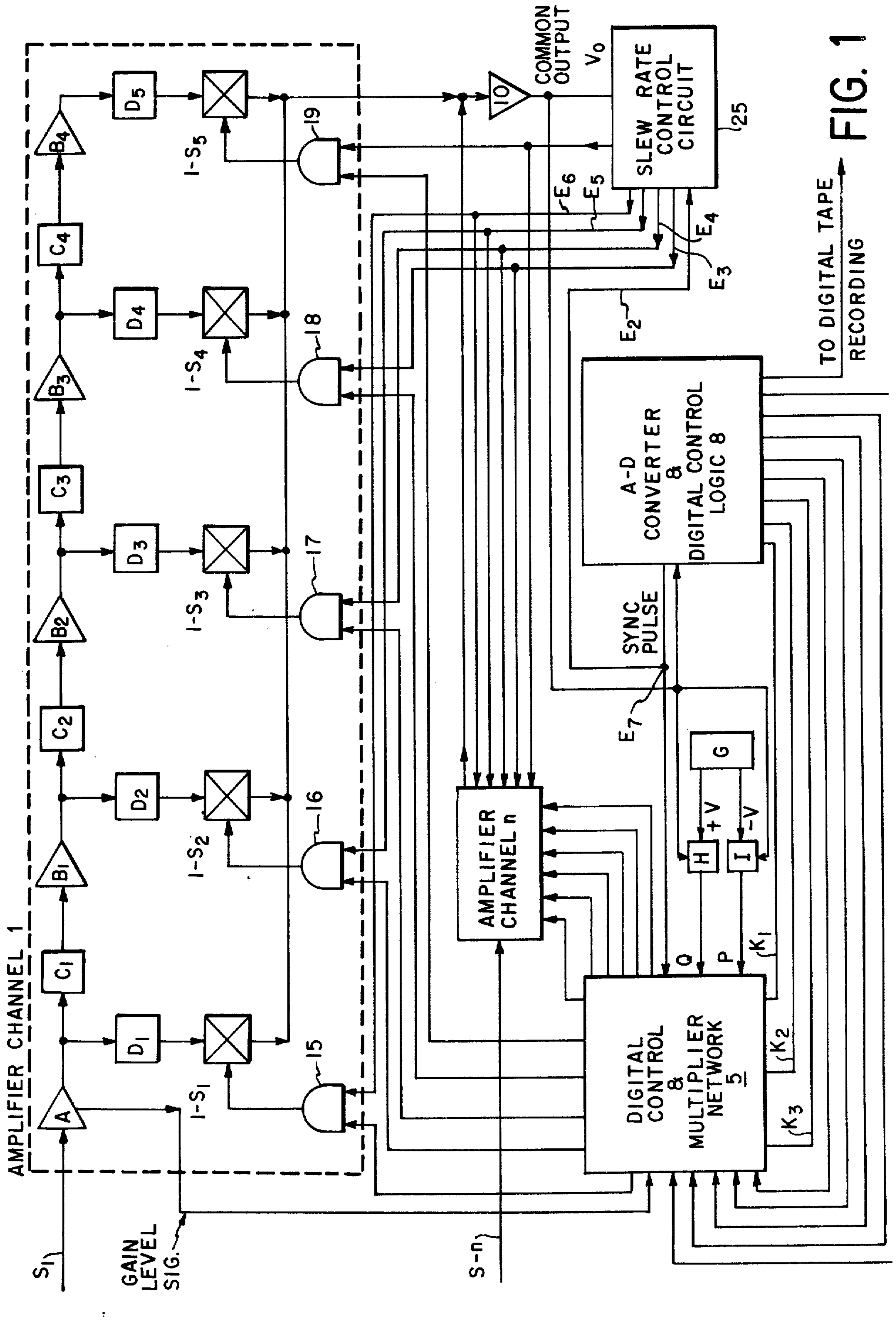
FIG. 1 is a simplified block diagram of a wide dynamic range amplifying system constructed in accordance with the present invention.

Referring to FIG. 1, there is shown an amplifier channel 1, an amplifier channel *n*, a digital control and multiplexer network 5, an A–D converter and digital control logic 8, common output amplifier 10, elements H, I and J cooperating to provide a wide dynamic range automatic high speed digital gain ranging amplifier system as described in U.S. Pat. No. 3,603,972. The aforementioned patent is assigned to Texaco Inc., assignee of the present invention. The difference in structure in the elements hereinbefore mentioned is that a plurality of AND gates 15, 16, 17, 18 and 19 have been added to channel 1. Corresponding AND gates (not shown) have also been added to channel *n*. The detailed description of the operation of the heretofore mentioned elements except for the AND gates is contained in the aforementioned U.S. Patent and will not be repeated except to generally describe the action of multiplexing the amplifier channels.

It will be appreciated that any number of amplifier channels of the type shown as channel 1 may be inserted between channels 1 and *n* and which may be effectively multiplexed by a plurality of signals from network 5. The gain is steadily increased by the activation of switches 1-$S_1$ through 1-$S_5$ until a passed signal has a desired predetermined relationship to a reference signal at which time it will be held for the remainder of the multiplexing cycle.

Under normal operation, at the beginning of each channel period, the gain is set to a minimum value. Following at specified time intervals, the gain will increase in discrete steps until the output signal exceeds full scale or until the maximum gain is reached. This provides the largest possible signal to the converter 8. However, if signal $S_1$ for example is a high amplitude signal and has a high frequency, a very large slew rate will occur as signal $S_1$ passes through zero. Since the instantaneous value of signal $S_1$ is small, the floating point amplifiers will try to gain range all the way to full gain. This amplifies the signal $S_1$ and also amplifies its slew rate with the result of the amplifier may have an output having a slew rate much too fast for the A-D converter 8 to sample. A slew rate control circuit 25 looks as the common output signal $V_o$ and provides switch control signals $E_2$ through $E_6$ to the amplifier channels 1, as hereinafter explained.

When AND gate 15 receives a multiplexing gain signal from network 5 and a control signal $E_6$ from circuit 25 at high levels, AND gate 15 provides a high level signal to switch 1-$S_1$, activating switch 1-$S_1$ causing it to pass the output signal from D1 to amplifier 10. Similarly AND gates 16–19 will in turn activate switches 1-$S_2$ through 1-$S_5$ in response to a multiplexing-gain signal and a control signal, from circuit 25.

Figure 2:
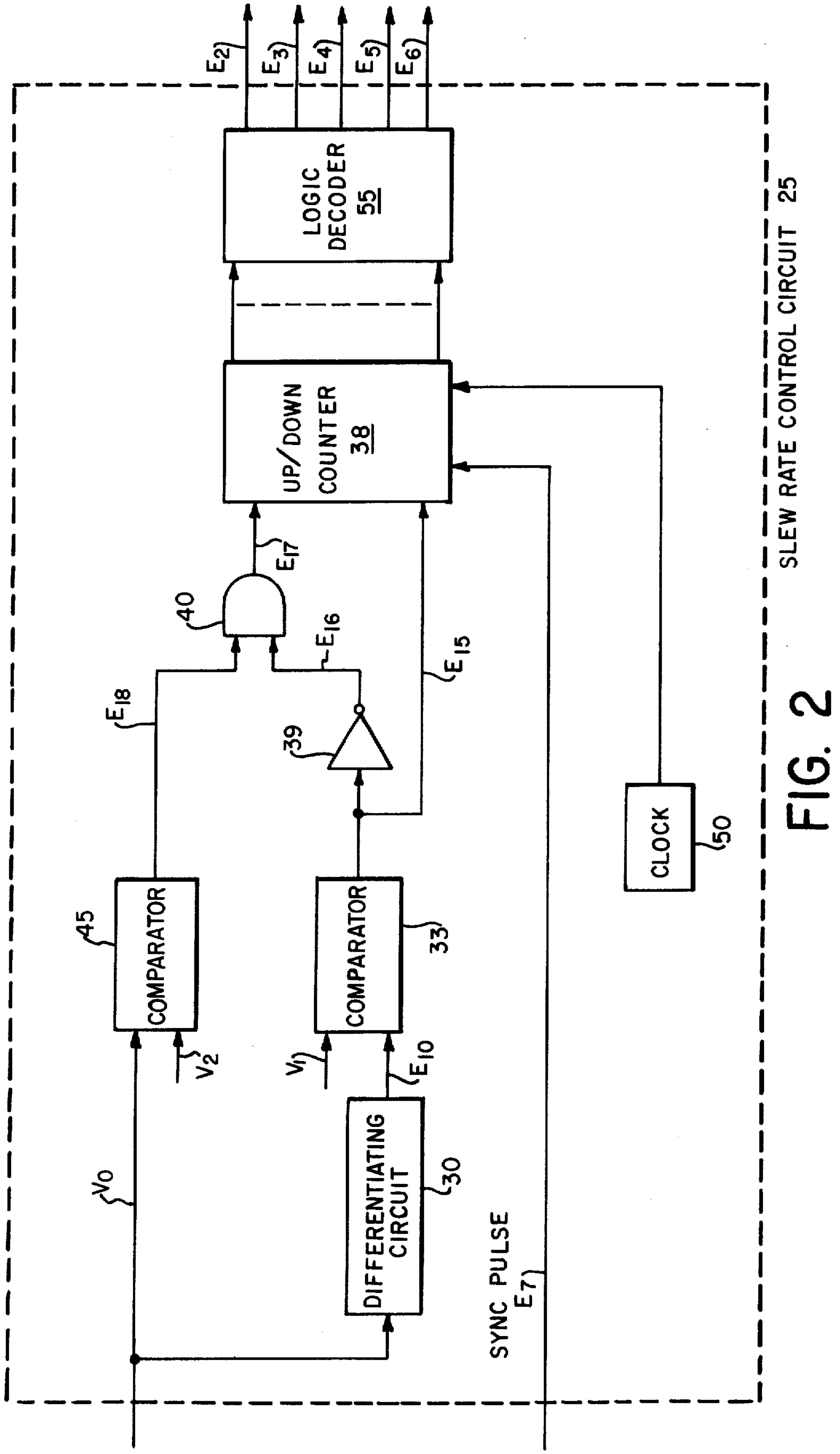
FIG. 2 is a detailed block diagram of the slew rate control circuit shown in FIG. 1.

Referring now to FIG. 2, output signal $V_o$ is applied to a differentiating circuit 30 where it is differentiated to provide a signal $E_{10}$ corresponding to the slew rate *ds/dt* of signal $S_1$. Signal $E_{10}$ is applied to a comparator 33 receiving a reference direct current voltage $V_1$ corresponding to a maximum slew rate *ds/dt* so that comparator 33 functions as a slew rate detector. When *ds/dt* (signal $E_{10}$) is greater than the maximum slew rate *ds/dt* max (voltage $V_1$) comparator 33 provides a signal $E_{15}$ at high level as a gain decrease signal to an updown counter 38 and to an inverter 39.

When signal $E_{15}$ is at a high level, inverter 39 provides a signal $E_{16}$ at a low level to an AND gate 40 thereby disabling AND gate 40. AND gate 40 when enabled provides a gain increase signal $E_{17}$ at a high level to updown counter 38.

Output $V_o$ is also applied to another comparator 45 receiving a reference direct current voltage $V_2$ corresponding to full scale divided by the gain of one stage, hereinafter referred to as full scale/G. Comparator 45 provides signal $E_{18}$ at a low level to AND gate 40 when the magnitude of output $V_o$ is greater than reference voltage $V_2$ and signal $E_{18}$ at a high level when the magnitude of output $V_o$ is less than full scale/G.

When output $V_o$ is not greater than full scale/G it is permissible to increase the gain thereby increasing the amplitude of output $V_o$. When signal $E_{18}$ is at a high level, AND gate 40 is partially enabled. When the comparator 33 indicates that the $E_{10}$ is not exceeding its maximum value, signal $E_{15}$ from comparator 33 is at a low level causing inverter 39 to provide signal $E_{16}$ at a high level which fully enables AND gate 40 to provide a signal $E_{17}$ at a high level to up/down counter 38.

Up/down counter 38 is reset by sync pulse $E_7$ to a value of 1 although it will be obvious to one skilled in the art that it can be set to any value. Counter 38 receiving timing pulse from a clock 50 is controlled by signals direction indicated by the levels of the signals $E_{15}$ and $E_{17}$ from comparator 33 and AND gate 40, respectively. When signal $E_{17}$ is at a high level, signal $E_{15}$ is at a low level and counter 38 counts up the timing pulses from clock 50. When signal $E_{15}$ is at a high level, signal $E_{17}$ is at a low level causing counter 38 to count down the timing pulses from clock 50. When signals $E_{15}$, $E_{17}$ are at low levels, counter 38 does not count the timing pulses from clock 50. The count in counter 38 is decoded by a logic decoder 45 which may be of a conventional type to provide switch control signals $E_2$ through $E_6$.

Thus, when the slew rate is too fast, signal $E_{10}$ from circuit 30 causes comparator 33 to provide gain decrease signal $E_{15}$ at a high level. The next pulse from clock 50 will decrease the count so that whatever control signal was being provided by decoder 55 at a high level instead of going to a low level, and the next subsequent control signal going from a low level to the high level, the signal will go to the low level but the next preceding control signal will go to a high level.

For the condition where $V_o$ will exceed full scale/G, comparator 45 provides signal $E_{18}$ at a low level causing AND gate 40 to provide signal $E_{17}$ at a low level to counter 38. When the slew rate has not exceeded its maximum, comparator 33 provides signal $E_{15}$ at a low level output to counter 38. As noted before, counter 38 will not count the timing pulses from clock 50 when signals $E_{15}$, $E_{17}$ are at low levels. When the slew rate exceeds its maximum value, comparator 33 provides a signal $E_{15}$ at a high level output since signal $E_{17}$ is at a low level counter 38 counts down the timing pulses from clock 50.

The amplifier system as heretofore described is a gain ranging amplifier system having circuitry for controlling the slew rate so that the output signal provided to an A-D converter will not exceed the sampling capability of the A-D converter nor will it overdrive the A-D converter.

What is claimed is:

1. A wide dynamic range automatic high-speed gain ranging amplifier system comprising a plurality of amplifier stages, each stage having a predetermined gain, a respective input circuit and a respective output circuit, the amplifiers being coupled in cascade relationship whereby the respective output circuit of each amplifier stage, except a last amplifier stage, is coupled to the respective input circuit of the next following amplifier stage of the cascade relationship; a common output circuit providing an output signal, means for providing reference signals, first comparing means connected to the common output circuit and to the reference signal means for comparing the output signal with predetermined reference signals and providing a first comparision signal corresponding thereto, the improvement comprising a plurality of switches, each switch connecting an output circuit of a corresponding amplifier stage to the common output circuit and being responsive to a pulse to pass an output from the corresponding amplifier stage to the common output circuit which provides the passed output as the output signal, a plurality of AND gates, each AND gate being connected to a corresponding switch and controlled by a control signal to pass a pulse to the corresponding switch or to block a pulse, multiplexing means connected to the AND gates and to the first comparing means for providing sampling and holding pulses each multiplexing cycle to the AND gates in accordance with the first comparison signal so that the AND gates are controlled by the pulses, and the control signals to control the switches to pass the outputs from the amplifier stages to the common output circuit in sequence until the output signal exceeds a reference signal, at which time the amplifier stage output, which caused the output signal to exceed the reference signal, is passed to the common output circuit for the remainder of the multiplexing cycle, or when none of the outputs from the amplifier stages causes the output signal to exceed a reference signal, the output from the last amplifier stage is passed to the common output circuit for the remainder of the multiplexing cycle, unless during the multiplexing cycle the changing output signal exceeds a predetermined maximum allowable slew rate or a predetermined maximum allowable instantaneous level; means connected to the common output circuit for providing a signal corresponding to the slew rate of the output signal in accordance with the output signal; means for providing a signal corresponding to the predetermined maximum allowable slew rate for the output signal; second comparing means connected to the slew rate signal means and to maximum allowable slew rate signal means for comparing the slew rate signal with the maximum allowable slew rate signal and providing a second comparison signal corresponding thereto, means for providing a signal corresponding to a predetermined maximum allowable instantaneous level for the output signal, third comparing means connected to the common output circuit and to the maximum allowable instantaneous level signal for comparing the output signal with the maximum allowable instantaneous level signal and providing a third comparison signal corresponding thereto; and control signal means connected to the AND gates and to the second and third comparing means for providing a different control signal to each AND gate in accordance with the second and third comparison signals so that the AND gates are individual enabled in sequence to pass an applied pulse unless the slew rate of the output signal exceeds the maximum allowable slew rate or unless the instantaneous level of the output signal exceeds the maximum allowable instantaneous level at which time the next preceding AND gate is enabled for the remainder of the multiplexing cycle; said control signal means includes bidirectional counting means, means for providing counting pulses to the counting means, means connected to the counting means and to the second and third comparing means for controlling the counting means to count the counting pulses in one direction when the amplitude of the output signal does not exceed the amplitude of the maximum allowable instantaneous level signal and the slew rate of the output signal does not exceed its maximum allowable slew rate, to count the counting pulses in an opposite direction when the slew rate of the output signal exceeds the maximum allowable slew rate, and not to count the counting pulses when the amplitude of the output signal exceeds the maximum allowable instantaneous level signal and the slew rate of the output signal does not exceed the maximum allowable slew rate; and means connected to the counting means for decoding the count in the counting means to provide the control signals.

2. A system as described in claim 1 in which the control means includes means connected to the second comparing means and to the counting means for providing the signal to counting means so that when the slew rate signal is greater than maximum slew rate signal, the signal from the second comparing means causes the counting means to count down, inverter means connected to the second comparing means for inverting the signal from second comparing means, AND gate means connected to the counting means, to the third comparing means and to the inverting means for causing the counting means to count up when the amplitude of the output signal is less than the amplitude of the second reference signal and the slew rate signal amplitude is not greater than the amplitude of the maximum slew rate signal.

3. A system as described in claim 2 in which the amplifier stages, the switches and the plurality of AND gates comprise an amplifier channel, and further comprising at least one more amplifier channel, and means for multiplexing the amplifier channels to provide signals to the common output circuit.

4. A method for amplifying a wide dynamic range input signal with amplifier circuits, arranged in a cascade manner to provide a plurality of amplified outputs, each output being provided by a corresponding amplifier circuit and having a predetermined gain relationship to the input signal; providing predetermined reference signals with a reference signal source; providing an output signal with a common output circuit; comparing the output signal with the reference signals with a first comparator circuit which provides a corresponding first comparison signal; the improvement comprises controlling a plurality of switches with pulses, each switch connecting a corresponding amplifier circuit to the common output circuit and being responsive to a pulse to pass an amplified output from the corresponding amplifier circuit to the common output circuit which provides the passed output as the output signal; controlling a plurality of AND gatds with control signals, each AND gate being connected to a corresponding switch and controlled by a control signal to pass a pulse applied to the AND gate to the corresponding switch or block a pulse applied to the AND gate; providing sampling and holding pulses to the AND gates with a multiplexing circuit each multiplexing cycle and in accordance with the first comparison signal from the first comparator circuit so that the AND gates are controlled by pulses and the control signals to cause the switches to pass the amplified outputs from the amplifier circuits to the common output circuit in sequence until the output signal exceeds a reference signal, at which time the amplified output, which caused the output signal to exceed the reference signal, is passed to the common output circuit for the remainder of the multiplexing cycle, or when none of the amplified outputs causes the output signal to exceed a reference signal, the amplified output from the last amplifier circuit is passed to the common output circuit for the remainder of the multiplexing cycle, unless during the multiplexing cycle the changing output signal exceeds a predetermined maximum allowable slew rate or a predetermined maximum allowable instantaneous level; providing a slew rate signal in accordance with the output signal with a slew rate signal circuit connected to the common output circuit; providing a signal corresponding to the predetermined maximum allowable slew rate for the output signal with a signal source; comparing the slew rate signal with the maximum allowable slew rate signal with a second comparator circuit to provide a corresponding second comparison signal; providing a signal, corresponding to the predetermined maximum allowable instantaneous level for the output signal, with the signal source; comparing the output signal with the predetermined maximum allowable instantaneous level signal with a third comparator circuit to provide a corresponding third comparison signal; providing the control signals to the AND gates with a control signal circuit and in accordance with the second and third comparison signals so that the AND gates are individually enabled to pass an applied pulse unless the output signal's slew rate exceeds the maximum allowable slew rate or unless the output signal's instantaneous level exceeds the maximum allowable instantaneous level at which time the next preceding AND gate is enabled for the remainder of the multiplexing cycle; said control signal providing step includes providing counting pulses with a pulse source; counting the counting pulses in one direction with a bidirectional counter when the amplitude of the output signal does not exceed the amplitude of the maximum allowable instantaneous level signal and the output signal's slew rate does not exceed the maximum allowable slew rate, counting the counting pulses in an opposite direction with the bi-directional counter when the output signal's slew rate exceeds the maximum allowable slew rate, and not-counting the counting pulses when the output signal's exceeds the maximum allowable instantaneous level signal and the output signal's slew rate does not exceed the maximum allowable slew rate; and decoding the count in the bi-directional counter with a decoder to provide the control signals.

* * * * *